US006928122B2

(12) United States Patent
Opas et al.

(10) Patent No.: US 6,928,122 B2
(45) Date of Patent: Aug. 9, 2005

(54) AMPLIFIER PREDISTORTION SYSTEM AND METHOD

(75) Inventors: George F. Opas, Park Ridge, IL (US); Andrew M. Khan, Schaumburg, IL (US); Robert Palandech, Atlanta, GA (US)

(73) Assignee: Motorola, Inc., Schaumburg, IL (US)

( * ) Notice: Subject to any disclaimer, the term of this patent is extended or adjusted under 35 U.S.C. 154(b) by 841 days.

(21) Appl. No.: 09/876,803

(22) Filed: Jun. 7, 2001

(65) Prior Publication Data

US 2002/0186783 A1 Dec. 12, 2002

(51) Int. Cl.[7] ............................................... H04K 1/02
(52) U.S. Cl. .................... 375/296; 375/285; 375/295; 375/297; 330/149; 445/126
(58) Field of Search .............................. 375/285, 297, 375/295, 296; 455/126; 330/2, 51, 149, 151

(56) References Cited

U.S. PATENT DOCUMENTS

| 5,949,283 A | * | 9/1999 | Proctor et al. | 330/149 |
| 5,959,500 A | * | 9/1999 | Garrido | 330/151 |
| 6,567,478 B2 | * | 5/2003 | Oishi et al. | 375/297 |

FOREIGN PATENT DOCUMENTS

EP  0 658 975 B1  7/2000

OTHER PUBLICATIONS

An article entitled "Amplifier Linearization Using a Digital Predistorter with Fast Adaptation and Low Memory Requirements" by James K. Cavers, taken from IEEE Transactions on Vehicular Technology, vol. 39, No. 4, Nov. 1990, pp. 374–382.

An article entitled "A Linearizing Predistorter With Fast Adaptation" by James K. Cavers, Communications Science Laboratory, School of Engineering Science, Simon Fraser University, 1990 IEEE, pp. 41–47.

An article entitled "Adaptive Linearization Using Predistortion—Experimental Results" by Michael Faulkner, Member, IEEE, and Mats Johansson, Student Member, IEEE, taken from IEEE Transactions on Vehicular Technology, vol. 43, No. 2, May 1994, pp. 323–332.

* cited by examiner

*Primary Examiner*—Shuwang Liu

(57) ABSTRACT

An adaptive predistortion linearization system includes input path digital-to-analog converters (DACs), error path DACs, a digital signal processor, and a radio frequency (RF) combiner. The digital signal processor includes a look-up table storing complex gain coefficient values. The digital signal processor generates an error signal based on the complex input signal and the complex gain coefficients by using a vector decomposition calculation. Feedback from a power amplifier can be provided to a training algorithm for periodically updating the gain coefficient values stored in the look-up table. By performing separate D/A conversions, the error path and input signals can be separately filtered. This separation also permits the error signal to be decoupled from the complex input signal, which facilitates an improvement in the wide-frequency-offset noise performance of the system.

34 Claims, 6 Drawing Sheets

AMPLIFIER PREDISTORTION SYSTEM AND METHOD

TECHNICAL FIELD OF THE INVENTION

The present invention relates generally to adaptive linearization of amplifiers using predistortion, and in particular, to a digital predistortion system employing an error-vector topology.

BACKGROUND OF THE INVENTION

Some radio frequency (RF) communication systems employ constant-envelope modulation schemes, such as frequency modulation (FM) or constant phase modulation (CPM), thereby allowing power amplifiers and transmitters to work in the non-linear operating zone near saturation. This permits the power efficiency of the amplifiers to be increased, without generating intermodulation products in adjacent channels. However, as the popularity of RF mobile communications has increased, the availability of spectrum has become limited. To more efficiently utilize available spectrum, other types of modulation, which are more spectrally efficient, have been developed, such as n-QPSK (quadrature phase shift keying) and n-QAM (quadrature amplitude modulation) with baseband filtering. Unfortunately, these more efficient modulation techniques do not feature constant envelopes and they are more likely to create spectral disturbances due to intermodulation products.

One way to avoid interference caused by intermodulation products, is to permit RF power amplifiers to operate in their linear range. However, this leads to a significant decrease in the power efficiency of the amplifiers.

To overcome these distortion and efficiency problems, predistortion circuits have been developed for adaptively linearizing power amplifiers so that they may operate in the non-linear range. FIG. 1 is a graphical representation 10 of a typical power amplifier magnitude characteristic showing output compression. As the input level to the amplifier increases, the operation of the amplifier becomes non-linear. In the non-linear range, the amplifier output becomes compressed. To make up for the compression, i.e., linearize the amplifier, more drive power descriptively termed a "push" increment is added to the input level to achieve the desired linear output (dashed line) in the non-linear range. Essentially, the amplifier can be driven in a linear fashion by combining a predistortion signal with the original input level.

U.S. Pat. No. 5,049,832 by Cavers describes a predistortion approach for adaptively linearizing a power amplifier over its operational range. The predistorted drive signal of the Cavers approach is generated by multiplying a complex modulated input signal by complex gain coefficients stored in an adaptively determined look-up table (LUT). In its digital form, the predistorted drive signal is a composite signal consisting of an input component along with an inverse distortion signal. This composite signal is applied to appropriate digital-to-analog converters (DACs) for conversion to baseband analog signals before being applied to the power amplifier. In the predistortion system of the Cavers patent, the entire predistorted drive signal is processed through one set of I/Q DACs. This limits the wide offset signal-to-noise ratio at the system output to a level directly determined by the bit resolution of the I/Q DACs. Although this may be acceptable in some communication systems, in other systems, this limitation could negatively affect the overall system performance.

An alternative approach that has been used to achieve lower noise at wide offsets involves placing cavity filters at the outputs of the transmitter power amplifiers. In some circumstances, this approach has been highly beneficial. However, cavity filters are relatively expensive, and they generally reduce transmitter output power and add to the packaging volume of transmitters.

Accordingly, there is a need for an adaptive digital predistortion system that can be used to linearize RF power amplifiers and reduce off-channel noise caused by the limited precision of DACs and analog to digital converters (ADCs).

DETAILED DESCRIPTION OF THE PRESENTLY PREFERRED EMBODIMENTS

It is an advantage of the present invention to provide an improved digital predistortion system that can be used to linearize RF power amplifiers. The predistortion system includes an error-vector hardware topology and the use of non-realtime system training. Non-realtime system training, performed sufficiently slowly, must be employed in physically implemented systems that contain memory. The error-vector arrangement permits improvement in wide offset signal-to-noise performance that would otherwise be constrained by the resolution of DACs used by the system. Specifically, the noise can practically be improved by approximately an additional 12 dB at wide channel offsets than DAC resolution would normally imply in a conventional digital predistortion system.

The improved performance is accomplished in the error-vector topology by separating the boundary between digital and analog processing into two paths, namely, a main input path and an error component path. In typical predistortion systems, the error component signal has a wide spectrum when compared to the input signal. By separating the error path and the main input path, separate filtering approaches can be employed for the narrowband input signal and the wideband error signal. In addition, the error component signal can be decoupled from the main input signal by a predefined amount so that its peak level remains below that of the main input signal by a predefined factor, such as 12 dB. After being separately processed, the error component signal and main input signal are combined using RF vector addition to generate a wideband predistorted drive for input to a power amplifier.

The improved predistortion system of the present invention is particularly useful in narrow bandwidth applications of power amplifiers, such as RF communication systems having stringent off-channel noise requirements, such as some paging, cellular, and wireless communication systems.

Figure 1:
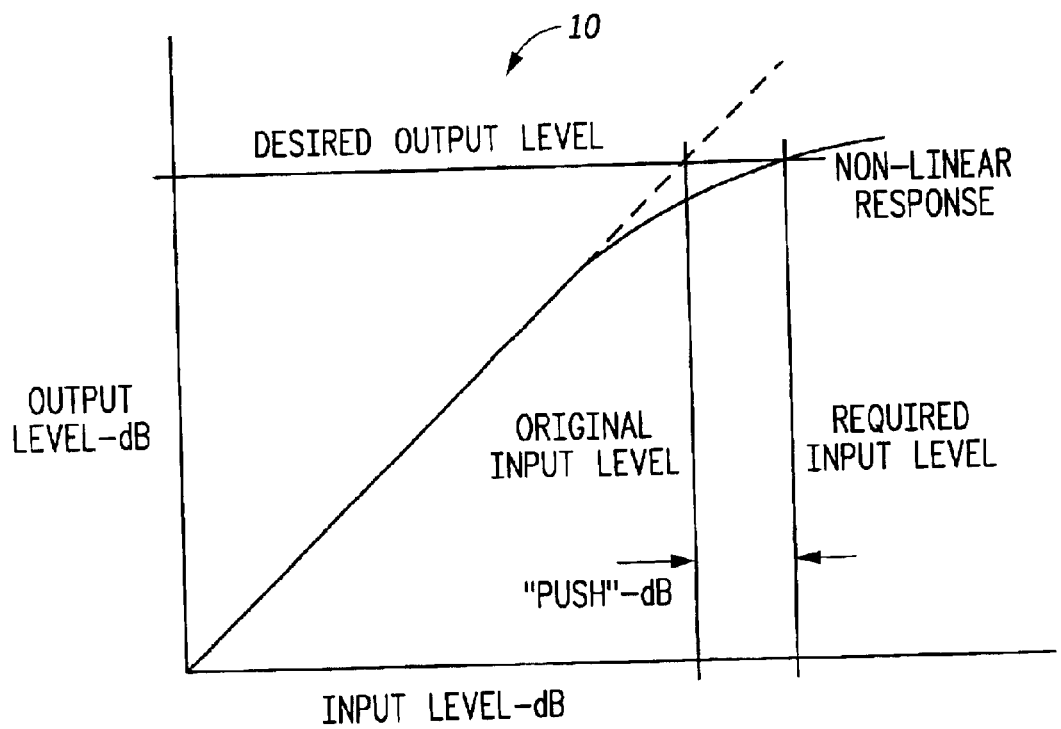
FIG. 1 is a graph illustrating the input/output magnitude characteristics of a typical power amplifier.
Figure 2:
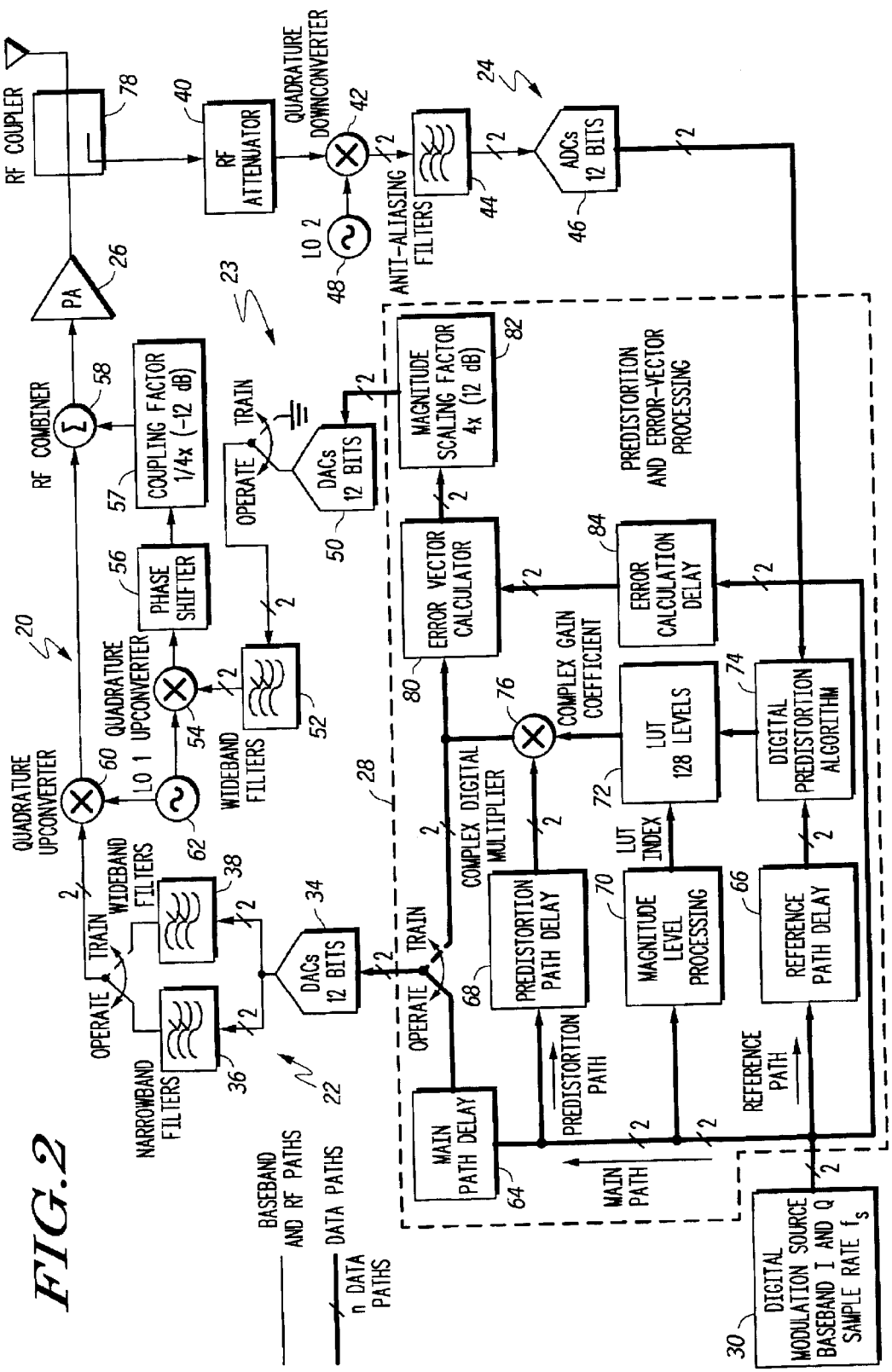
FIG. 2 is a block diagram of a predistortion system in accordance with an embodiment of the present invention.

Turning now to the drawings, and in particular to FIG. 2, there is illustrated a predistortion system 20 in accordance with an embodiment of the present invention. The predistortion system 20 includes main path circuitry 22, error path circuitry 23, feedback path circuitry 24, and a digital signal processor (DSP) 28. The system 20 provides an enhanced predistorted drive signal as input to a power amplifier (PA) 26. The system 20 can be included in a transmitter usable in an RF communication subscriber or infrastructure application, such as a mobile system, paging system, cellular system, or the like.

A digital modulation source 30 provides a digital complex modulated input signal to the DSP 28. The input signal can be a baseband signal carrying information modulated using a conventional modulation scheme such as QPSK or QAM. The digital modulation source 30 can provide baseband I and Q component signals at a sample rate $f_s$ that in practice can be approximately 4× the distortion bandwidth, for example, 2 MSPS (million samples per second) on each of the I and Q channels.

The main path circuitry 22 includes a pair of I and Q digital-to-analog (DACs) 34, a narrowband operating path reconstruction filter 36, and a wideband training path reconstruction filter 38. The main path is split into selectable wideband training and narrowband operating paths, represented by the wideband filter 38 and narrowband filter 36, respectively. During training, the wideband path permits faster settling in response to predistortion algorithm iterations, and, hence, faster overall system training.

The output of the main path circuitry 22 is upconverted to generate the reference input signal at the system RF carrier operating frequency determined by a local oscillator (LO) 62 using quadrature upconverter 60.

The error path 23 includes a pair of I and Q DACs 50, and reconstruction lowpass filters 52. A second quadrature upconverter 54 up converts the output of the error path circuitry 23 to generate the error-vector signal at the system RF carrier frequency, also determined by the local oscillator (LO) 62.

The RF output of the error path quadrature upconverter 54 is phase shifted by a phase shifter 56 to have the proper phase relationship to the upconverted main path signal at the output of quadrature upconverter 60 and also decoupled by a coupling factor 57.

An RF combiner 58 generates the predistorted drive signal by combining the decoupled error-vector RF signal and the main path RF signal. The resulting enhanced predistorted drive signal is then provided to the input of PA 26.

The circuit topology permits separate paths for modulated input signals and error signals. This approach is advantageous in that it permits separate filtering and decoupling of the wideband error-vector signal. In particular, transmitter noise improvement over prior art may be obtained at wide frequency offsets from the carrier by employing narrowband filtering in the main path carrying the modulated reference input signal and wideband filtering in the decoupled error-vector signal path. This requires that the DACs 34 and 50 in the main and error paths respectively be driven to their full dynamic range by the signals occurring in those paths.

The digital signal processor 28 includes a main path including a main path delay 64, a reference path including reference path delay 66, a predistortion path including a predistortion path delay 68, magnitude level processing 70, a look-up table (LUT) 72, a predistortion LUT training algorithm 74, a complex digital multiplier 76, an error calculation delay 84, an error-vector calculator 80, and a magnitude scaling function 82.

The LUT 72 stores a number of complex gain coefficient values corresponding to various input signal levels. Although the LUT 72 can be configured to store any suitable number of values, in the example shown, the LUT 72 stores 128 values.

In the digital signal processor 28, a suitable training algorithm 74 is used to "train" the LUT 72 to the characteristics of the PA 26 by forcing the error between a training reference input signal—appropriately delayed by reference path delay 66 for proper time alignment—and the distorted PA sample to approach zero. Different training algorithms can be used, but generally, the algorithm employs an iterative scheme.

An approach that facilitates large improvements in adjacent-channel coupled power employs a nonlinear equation solver as the key element of a nonlinear control system. One such scheme of linearization is described in "Amplifier Linearization Using a Digital Predistorter with Fast Adaptation and Low Memory Requirements", James K. Cavers, IEEE Transactions on Vehicular Technology, vol. 39, No. 4, pp. 374–382 ("Cavers"), the subject matter of which is hereby incorporated by reference.

The Cavers approach requires that an output sample of the power amplifier (PA) be downmixed using a frequency mixing block and sampled with a sampling device. The PA sample is represented by a digital word or several words. A second digital word that represents the analog input to the PA is stored in a processor. The processor calculates an error voltage according the respective values of the analog input sample and the PA sample. The error voltage provides input for the nonlinear root finder to update the LUT coefficients. An update of the value of an LUT coefficient is acquired from the root finder according to the value of the corresponding error voltage.

The method described in the Cavers article requires the root finder to be applied over a series of LUT index values. To maintain a reasonable LUT training time, the method also calls for the root finder to be applied to each of the index values for a maximum number of iterations. An iterative method of root finding offers the opportunity to refine the LUT coefficients, resulting in a decreased adjacent-channel coupled power produced by the transmitter after the iterative training. Each iteration of the training procedure requires a new PA sample; hence an analog training sequence is generated to excite the amplifier. The number of iterations of the analog training sequence is practically valued from seven to twelve. The iterative approach described in Cavers is compatible with the requirement for improved linearity.

While the present invention may be applied to a predistortion system using such an iterative method, it is not limited in its application to systems that rely on an iterative training engine. In alternative embodiments, the predistortion system may employ look up table training based on other methods such as curve fitting, model-reference adaptive control, or on approaches that rely on a statistical, rather than a power series based model, for the development of the LUT coefficients.

Figure 4:
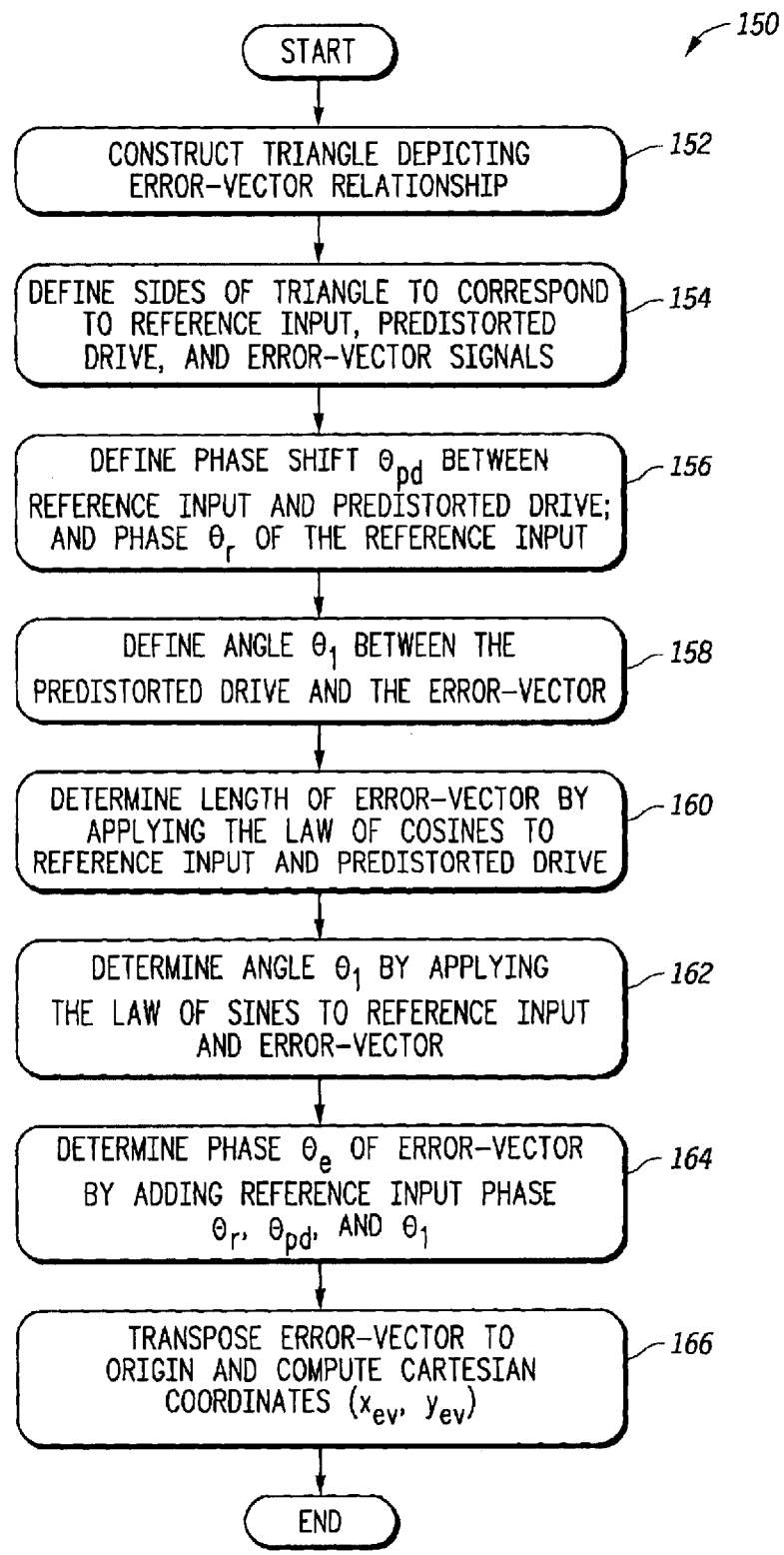
FIG. 4 is a flow chart illustrating an exemplary algorithm for generating an error-vector signal from a previously trained look-up table (LUT) and an input reference signal included in the system of FIG. 2.
Figure 5:
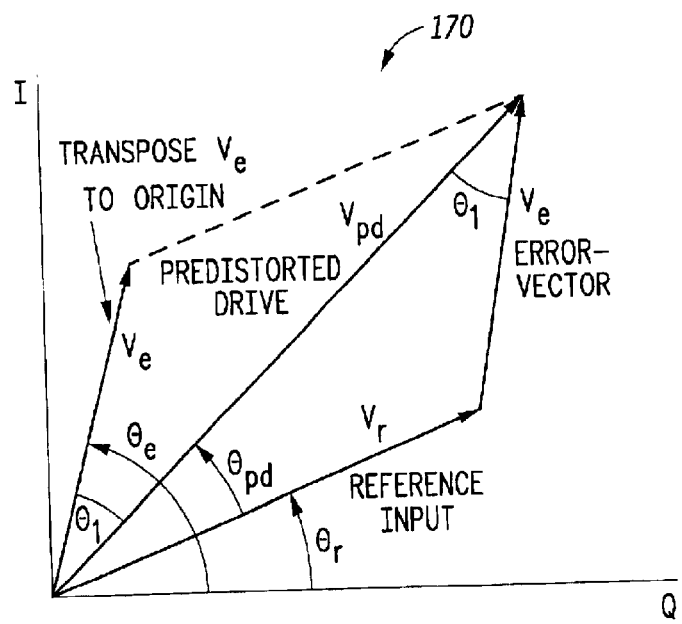
FIG. 5 is a graph depicting an exemplary phase plane triangle created by an input reference vector, a predistorted drive vector, and an error-vector as a geometric aid for the determination of the error-vector.

An exemplary algorithm for generating an error-vector signal from a previously trained look-up table (LUT) and an input reference signal is described herein in connection with FIGS. 4–5.

The system 20 has two modes of operation—a training mode and an operational mode. During the training node, a reference input training sequence is applied to the system 20 by the modulation source 30 and PA feedback is provided to the digital signal processor 28 by the feedback path 24.

The feedback path circuitry 24 is employed only during training of the LUT 72. The feedback path circuitry 24 includes an attenuator 40 coupled to an RF coupler 78 that provides a small portion of the output of the PA 26. The attenuator 40 can include a filter, for example, a microstrip filter. The output of the attenuator 40 is provided to a conventional analog quadrature downconverter 42, which down converts the PA output to baseband I and Q feedback signals using LO 48. The down-converted signals are then provided to I and Q-channel anti-aliasing filters 44. While two filters are employed in the main path at the input of the system to facilitate faster LUT training consistent with low transmission of DAC alias image products, the anti-aliasing filters 44 can be made considerably wider than wideband training path reconstruction filters 38 because of their application to reduce noise in an ADC function. As a result, their impact can be ignored relative to settling time during training algorithm iterations. The filter outputs are then digitized using the analog-to-digital converters (ADCs) 46. The digitized feedback is then provided to the digital signal processor 28. The functions of the feedback path circuitry 24 can alternatively be performed, for example, using a non-quadrature RF downconverter to downmix to an intermediate frequency (IF), a single analog-to-digital converter (ADC), and a digital down-converter implemented using a Halfband Filter integrated circuit (IC), Part No. HSP43216, available from Intersil Corporation.

While FIG. 2 depicts a Cartesian coordinate implementation of the error-vector predistortion circuit, the circuit can also be built using a polar coordinate implementation employing polar error signals configured as a multiplicative error phasor.

Figure 3:
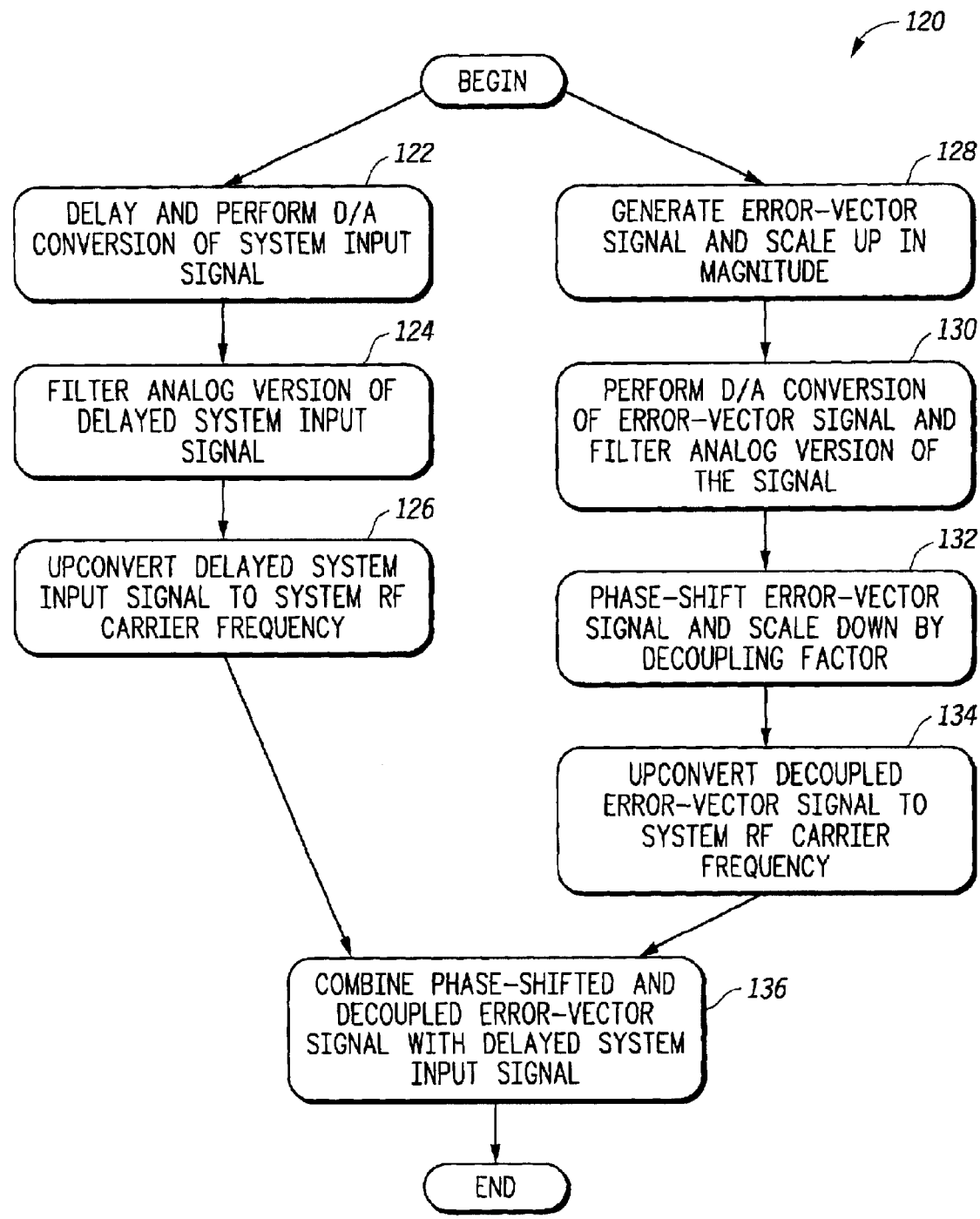
FIG. 3 is a flow chart illustrating the operation of the system shown in FIG. 2.

FIG. 3 is flow chart 120 illustrating the operation of the system 20 shown in FIG. 2. Steps 122–126 depict the operation of the main path circuitry 22, while steps 128–134 depict operation of the error path circuitry 23.

In step 122, the system input signal from digital modulation source 30 to the digital signal processor 28 passes through main path delay 64 prior to becoming the main path output signal from digital signal processor 28. The purpose of the main path delay 64 is to provide time alignment between the main path signal and the error signal. The digital-to-analog (D/A) conversion of the complex modulated main path signal is performed by the main path DACs 34.

In step 124, the analog outputs of the DACs 34 are filtered by either the narrowband filters 36 or the wideband filters 38, depending on the operational mode of the system 20. During normal operation of system 20, both the main and error paths are active and the narrowband filters 36 are selected. However, if the system 20 is in the training mode, only the main path is active and the wide band filters 38 are selected. The wideband path permits faster settling in response to predistortion algorithm iterations, and, hence, faster overall system training. For example, in a system having a modulation bandwidth of approximately 40 kHz, the narrowband filters 36 can each be 150 kHz bandwidth 3-pole lowpass Butterworth filters. The wideband filters 38 can each be 605 kHz bandwidth 6-pole lowpass Butterworth filters.

In step 126, the filtered outputs are upconverted to the system carrier operating frequency by quadrature upconverter 60.

In step 128, an error-vector signal is generated by the digital signal processor 28 in response to the complex modulated system input signal. The error-vector is generated through several steps. First, an input level index is derived from the magnitude of the input signal by magnitude level processing block 70. This index is then applied to the lookup table LUT 72 to retrieve a corresponding complex predistortion gain coefficient. The complex modulated input signal, delayed through predistortion path delay 68, is then multiplied by the complex predistortion gain coefficient to generate the complex predistorted PA drive signal. The purpose of predistortion path delay 68 is to provide time alignment between the presence of the complex predistortion gain coefficient and the complex modulated input signal. In the training mode, the complex predistorted drive signal becomes the main path output signal from digital signal processor 28. Simultaneously, the inputs to the reconstruction lowpass filters (LPFs) 52 in error path 23 are set to zero (grounded input state). During normal operation, the complex predistorted drive signal is applied to error vector calculator 80 while the complex modulated system input signal, delayed for proper time alignment through error calculation delay 84, is also applied to error vector calculator 80 as a reference signal. Through trigonometric math operations, the complex modulated system input signal is vectorially subtracted from the complex predistorted PA drive signal to generate the error-vector signal. The error-vector signal is then scaled up in magnitude through magnitude scaling function 82 to fully utilize the dynamic range of error path DACs 50.

In step 130, the scaled error-vector signal undergoes digital-to-analog conversion by the error path DACs 50. The outputs of the DACs 50 are then filtered by the reconstruction lowpass filters (LPFs) 52. As an example, the LPFs 52 can each be 605 kHz bandwidth 6-pole Butterworth filters in a system having an input modulation bandwidth of approximately 40 kHz.

In step 132, the filtered error-path signal is appropriately phase-shifted by phase shifter 56 to provide the proper phase shift with respect to the upconverted main path signal from quadrature upconverter 60 and is also scaled down in magnitude by coupling factor 57. The coupling factor is the inverse of the scaling factor applied by the magnitude-scaling factor 82. The filtered, phase-shifted, and scaled error-path signal is upconverted to the system carrier operating frequency by quadrature upconverter 54.

In step 136, the upconverted error-vector signal is combined with the upconverted main path signal by RF combiner 58 to produce the enhanced predistorted drive signal, which is input to the power amplifier 26.

The error-vector approach to gain-based PA linearization introduces a vector decomposition calculation after the training algorithm is implemented on initial training of the predistortion LUT 72 and which may subsequently be invoked due to slow changes in the operating conditions of power amplifier 26. The training algorithm for the error-vector approach determines the predistorted drive signal necessary to linearize the output of PA 26. When a sequence of inputs representing a series of input training samples is applied to the system 20, the magnitude (or a function of the magnitude) of the samples in the sequence is used to call up one of a number of quantized complex gain values stored in the LUT 72. The input signal vector is multiplied by the complex gain value to produce the predistorted drive signal.

FIG. 4 is a flow chart diagram 150 illustrating a preferred method of providing the error-vector in real time from the previously trained LUT 72 and knowledge of the system input reference signal. The error-vector relationship between the reference input, the error-vector, and the predistorted drive signals is represented geometrically by a triangular depiction (step 152) illustrated in FIG. 5.

The predistorted drive vector is defined as side $V_{pd}$, the reference input vector as side $V_r$, and the error vector as side $V_e$ of the triangle (step 154).

The phase shift between the reference input and predistorted drive signals defines angle $\theta_{pd}$ while the phase of the reference input signal vector in the I-Q plane is $\theta_r$ (step 156). The angle $\theta_{pd}$ is the phase portion of the LUT gain coefficient that is indexed by the magnitude or a function of the magnitude of a particular sample.

The angle between the predistorted drive and the error-vector signals is defined as $\theta_1$ (step 158)

The mathematical procedure required for the determination of the magnitude and phase of the error-vector can be applied using a microprocessor that executes a software algorithm or may be applied using custom logic hardware (step 160). For transmitter predistortion applications with high data rate channels there will be certain advantages realized by the transmitter by application of the custom logic hardware.

Determination of the Error Vector $V_e$ is accomplished through using trigonometric relationships known as the Law of Cosines and Law of Sines. Using the Law of Cosines (step 160), the magnitude of the error-vector $V_e$ can be found using the magnitudes of the reference input signal $V_r$, the desired predistorted drive signal $V_{pd}$, and the phase angle $\theta_{pd}$ between them as follows:

$$V_e = [|V_r|^2 + |V_{pd}|^2 - 2 \times |V_r| X |V_{pd}| \times \cos \theta_{pd}]^{1/2} \quad (1)$$

Using the Law of Sines and the value of $V_e$ found above in Eq. 1 (step 162), the angle $\theta_1$, between $V_e$ and $V_{pd}$ can be found:

$$\theta_1 = \sin^{-1}\{V_r \times (\sin \theta_{pd})/V_e\} \quad (2)$$

The phase $\theta_{pd}$ may be positive- or negative-valued. To allow the method of triangle construction to be used regardless of the sign $\theta_{pd}$, by convention angle $\theta_1$ must be positive-valued. The magnitude of $\theta_{pd}$ is taken as a preliminary step to the use of the law of cosines. Since the quantities $V_r$, $V_e$, and $\sin|\theta_{pd}|$ are all positive-valued, the inverse Sine calculation will provide a positive value for $\theta_1$.

The phase $\theta_e$ of the error vector $V_e$ in the I-Q plane is determined through simple addition of angles (step 164) as follows:

$$\theta_e = \theta_r + \theta_{pd} + \theta_1, \text{ given } \theta_{pd} \geq 0, \text{ or}$$

$$\theta_e = \theta_r + \theta_{pd} - \theta_1, \text{ given } \theta_{pd} < 0 \quad (3)$$

Finally, after computation of the error vector's magnitude and phase, the microprocessor (or custom logic) may find the Cartesian coordinates of the error-vector, transposed to the I-Q plane origin (step 166). The coordinates ($x_{ev}$, $y_{ev}$) are computed as:

$$X_{ev} = |V_e| \times \cos(\theta_e) \quad (4)$$

$$Y_{ev} = |V_e| \times \sin(\theta_e) \quad (5)$$

The microprocessor may encode the results into a format that sends the error-vector information at a baseband sample rate to the error path digital-to-analog converters.

As discussed above, during normal operation of the system 20, the predistorted drive signal $V_{pd}$ can be determined using the Law of Cosines with variables consisting of the input reference signal $V_r$ and the error signal $V_e$. The error-vector signal has a maximum value determined by the preset coupling factor between itself and the input signal $V_r$.

Figure 6:
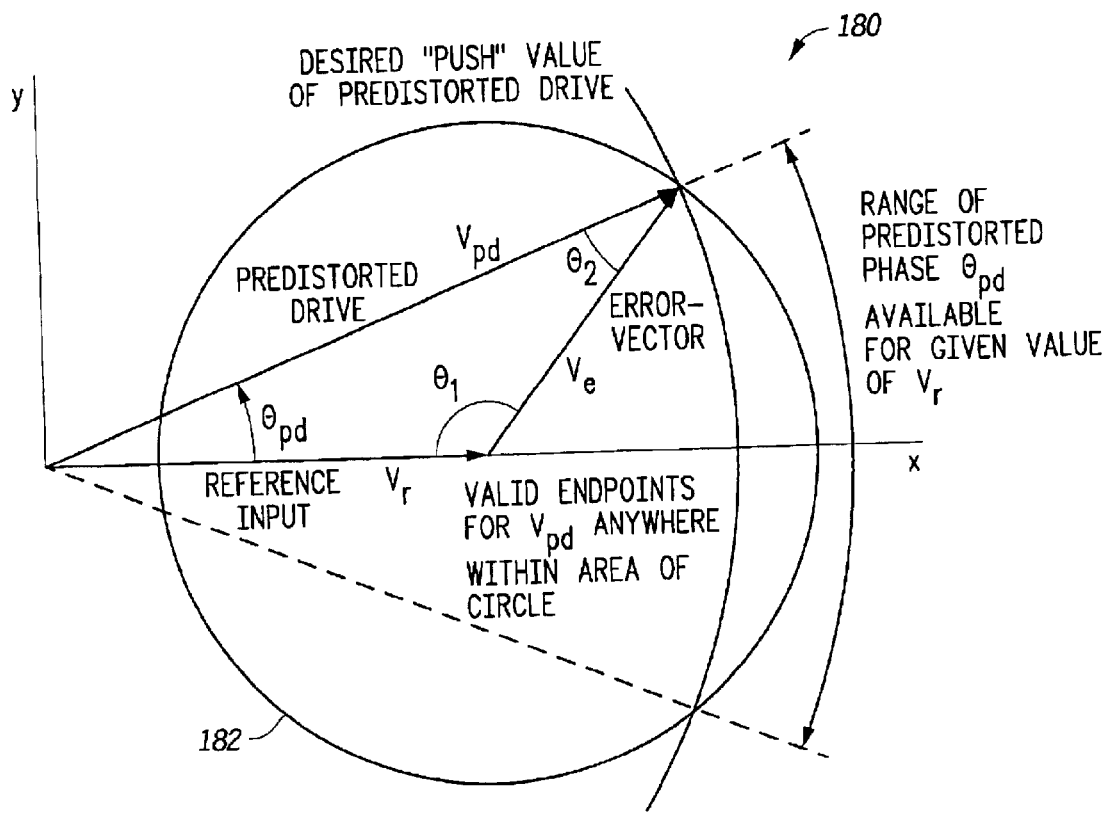
FIG. 6 is a graph depicting the geometry of available magnitude and phase for the predistortion system shown in FIG. 2.

Referring to FIG. 6, for a given ratio $V_e$ to $V_r$, the predistorted drive signal $V_{pd}$ can have its endpoint anywhere within the phase circle 182 having a radius $V_e$ and a center at the endpoint of $V_r$.

Figure 7:
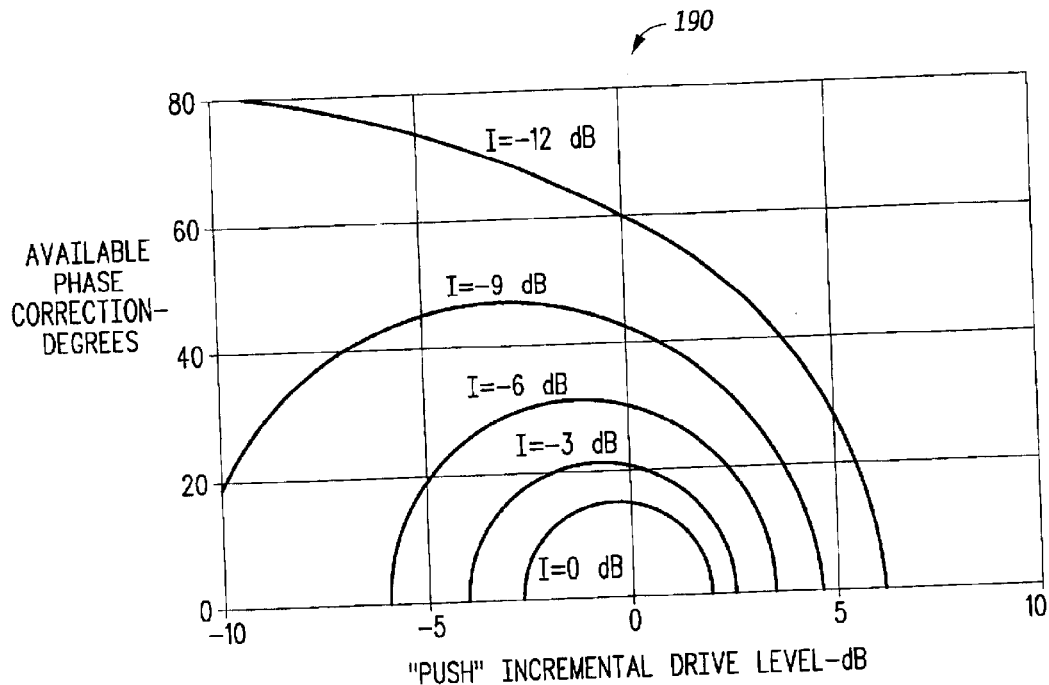
FIG. 7 is a plot of available phase correction for an example of the system of FIG. 2 for several levels of input signal magnitude.

A plot of maximum available phase correction provided by the error-vector approach with a nominal coupling of −12 dB between the input and error signal magnitudes is shown in FIG. 7. Curves representing five levels of the input signal magnitude labeled I=0 dB to I=−12 dB are included. This allows determination of the predistortion drive vector parameters as input signal drive is reduced while the maximum absolute magnitude of the error signal remains unchanged. It is apparent that the magnitude and phase range of the predistorted drive increases as the reference signal magnitude decreases. For example, when I=0, the PA can be driven an additional 1.93 dB harder to compensate for pure AM-AM compression—descriptively termed as a "push" level of 1.93 dB. The amount of PA gain compression that can be compensated can be less than 1.93 dB and is dependant on the specific PA gain characteristic. Alternatively, the phase of the drive signal to the PA can be shifted by 14.4 degrees to compensate for pure AM-PM conversion—with the "push" level being 0 dB. When I=−12 dB, the corresponding value for pure AM-AM is 6.02 dB and for pure AM-PM is 60 degrees. It should be noted that the "push" level could be negative, e.g., when the amplifier drive is reduced from the linear value to produce a desired output power level. With the range of amplitude and phase correction depicted in FIG. 6, a 12 dB coupling factor enables the error-vector topology to "predistort" a majority of PA implementations both near peak drive as well as at lower drive levels where distortion is also frequently present.

Figure 8:
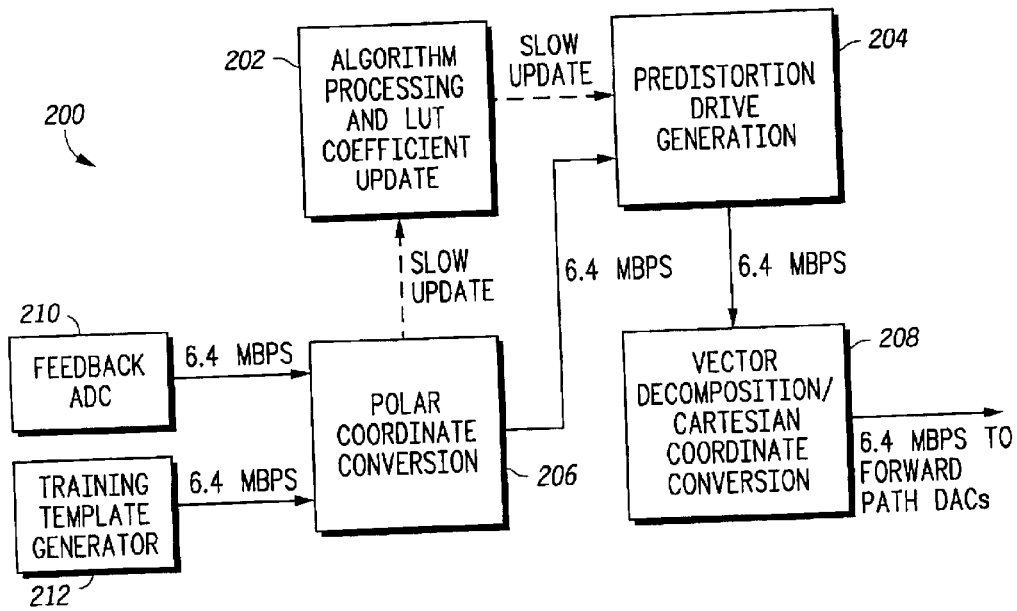
FIG. 8 is a block diagram of an exemplary digital signal processing architecture for implementing the DSP included in the predistortion system of FIG. 2.

FIG. 8 is a block diagram of an exemplary digital signal processing architecture 200 for implementing the DSP 28 included in the predistortion system 20. The architecture 200 can include one or more commercially-available digital signal processing microprocessors, such as the C62xx architecture available from Texas Instruments, configured with the software programs to perform the functions described herein. The architecture 200 includes four processing blocks 202–208. Each of the blocks can be implemented using a separate TI C62xx core.

The algorithm processing and LUT coefficient update block 202 consists of tasks such as a secant solution update, stability checking, control overhead, and transfer of results. The block 202 can execute the training algorithms disclosed herein.

The predistortion drive generation block 204 performs a gain-based non-linear operation in which the complex modulated input signal is multiplied by the complex LUT gain coefficient values stored in polar coordinates.

The optional polar coordinate conversion block 206 performs the coordinate conversion functions of the DSP. The conversion takes place twice, once on the input signal, and once on the feedback signal from the PA output. Although optional, operating in polar coordinates is advantageous because training algorithm convergence is generally more predictable.

The vector decomposition/Cartesian coordinate conversion block 208 can be a pipelined operation that calculates the error-vector component of the predistorted drive signal as described herein.

PA feedback is provided to the block 208 by the feedback ADC 210, which can be the ADCs 46 shown in FIG. 2.

For the training mode, a training template generator 212 generates a series of drive level steps corresponding to the desired LUT levels. The output of the template generator 212 is typically in Cartesian format, which optionally requires a coordinate conversion to polar coordinates in block 206. The converted drive is then multiplied by the complex polar LUT gain coefficients according to the input level received by the predistortion drive generation block 204.

A vector decomposition to determine the error-vector signal takes place in the block 208. Since the signal received from the block 204 is optionally in polar format, another coordinate conversion back to Cartesian coordinates takes place in the block 208. The output of the block 208 is then provided to the error path DACs 50.

While specific embodiments of the present invention have been shown and described, it will be apparent to those skilled in the art that the disclosed invention may be modified in numerous ways and may assume many embodiments other than those specifically set out and described above. Accordingly, the scope of the invention is indicated in the appended claims, and all changes that come within the meaning and range of equivalents are intended to be embraced therein.

What is claimed is:

1. A predistortion circuit, comprising:
   a first digital-to-analog converter (DAC) outputting a reference input signal in response to a digital input signal;
   a first filter outputting a filtered reference input signal in response to the reference input signal;
   an upconverter outputting a frequency-translated filtered reference input signal at a desired RF carrier frequency;
   a look-up table storing a plurality of complex gain coefficients, each of the complex gain coefficients being determined by forcing the error between the digital input signal and a scaled version of the system output signal towards zero, the look-up table outputting a complex gain coefficient corresponding to the the digital input signal;
   a complex multiplier multiplying each sample of the digital input signal by the complex gain coefficient to generate a complex predistorted drive signal;
   an error-vector calculator outputting complex error components corresponding to the complex predistorted drive signal, each of the error components being determined using a vector decomposition calculation;
   a magnitude scaling factor determined by the ratio of the peak magnitude of the digital input signal to the peak magnitude of the error components;
   a second DAC outputting an error-vector signal in response to the complex error components;
   a second filter outputting a filtered error-vector signal in response to the error-vector signal; and
   an upconverter outputting a frequency-translated filtered error-vector signal at a desired RF carrier frequency;
   a combiner for outputting a predistorted drive signal in response to the frequency-translated filtered reference input signal and the frequency-translated filtered error-vector signal.

2. The circuit of claim 1, further comprising:
   a main path delay responsive to the digital input signal.

3. The circuit of claim 1, wherein the first filter includes a pair of selectable filters.

4. The circuit of claim 3, wherein the pair of selectable filters includes a wide band filter and a narrow band filter.

5. The circuit of claim 4, wherein the narrow band filter is selected during normal operation of the circuit.

6. The circuit of claim 4, wherein the wide band filter is selected during training operation of the circuit.

7. The circuit of claim 1, wherein the digital input signal is a complex-modulated input signal.

8. The circuit of claim 7, wherein the first DAC includes an I DAC responsive to an I component of the digital input signal and a Q DAC responsive to a Q component of the digital input signal.

9. The circuit of claim 1, further comprising:
   a Cartesian-to-polar coordinates converter, operatively coupled to the look-up table, for outputting a polar representation of the digital output signal; and
   a magnitude level processing converter, operatively coupled to the look-up table, for outputting a plurality of indices corresponding to the magnitude of the digital input signal.

10. The circuit of claim 1, wherein the look-up table stores polar coordinate representations of the complex gain coefficients.

11. The circuit of claim 1, further comprising:
    a feedback path for providing a sample of the output signal of an amplifier driven by the circuit.

12. The circuit of claim 11, wherein the feedback path includes:
    at least one fitter receiving a signal corresponding to the output signal of the amplifier; and
    an analog-to-digital converter (ADC) for digitizing the filtered signal corresponding to the output signal of the amplifier.

13. The circuit of claim 11, further comprising:
    a predistortion training algorithm for generating the complex gain coefficients in response to the digital input signal and the output signal of the amplifier.

14. The circuit of claim 1, wherein the filtered error-vector signal coupled down in magnitude relative to the filtered input drive signal.

15. A predistortion system for an amplifier comprising:
    a first digital-to-analog converter (DAC) for outputting a reference input signal in response to a complex modulated digital input signal;
    a first filter for outputting a filtered reference input signal in response to the reference input signal, wherein the first filter includes a pair of selectable filters;
    a digital signal processor for outputting an error component signal in response to the complex modulated digital input signal;
    a second digital-to-analog converter (DAC) for outputting an error-vector signal in response to the error component signal;
    a second filter for outputting a filtered error-vector signal in response to the error-vector signal; and
    a radio frequency (RF) combiner for outputting a predistorted drive signal in response to the filtered error-vector signal and the filtered reference input signal.

16. The system of claim 15, wherein the pair of selectable filters includes a wide band filter and a narrow band filter.

17. The system of claim 16, wherein the narrow band filter is selected during normal operation of the system.

18. The system of claim 16, wherein the wide band filter is selected during training operation of the system.

19. The system of claim 15, further comprising:
a look-up table, operatively associated with the digital signal processor, for storing a plurality of complex gain coefficient values.

20. The system of claim 19, wherein each of the complex gain coefficient values is determined by forcing the error between the digital input signal and a scaled version of the system output signal towards zero.

21. The system of claim 19, wherein the look-up table stores polar coordinate representations of the complex gain coefficient values.

22. The system of claim 15, further comprising:
a feedback path for providing a sample of the output signal of the amplifier.

23. The system of claim 22, further comprising:
a predistortion training algorithm for generating error component values in response to the complex modulated input signal and feedback from the amplifier.

24. The system of claim 15, wherein the filtered error-vector signal is coupled down in magnitude relative to the filtered reference input signal.

25. The system of claim 15, wherein the amplifier is a power amplifier.

26. A system, comprising:
a power amplifier producing a power amplifier output in response to a predistorted drive signal;
a signal processor for outputting an error component signal based on a complex input signal;
a first pair of digital-to-analog converters for outputting reference input I and Q signals, respectively, in response to the complex input signal;
a second pair of digital-to-analog converters for outputting error-vector I and Q signals, respectively, in response to the error component signal;
a radio frequency (RF) combiner for outputting the predistored drive signal in response to the error-vector I and Q signals and the reference input I and Q signals; and
filtering means for filtering the reference input I and Q signals, wherein the filtering means includes wide band filter means and narrow band filter means.

27. The system of claim 26, wherein the narrow band filter means is selected during normal operation of the system.

28. The system of claim 26, wherein the wide band filter means is selected during training operation of the system.

29. The system of claim 26, further comprising:
a predistortion training algorithm, executable by the signal processor, for producing a look up table of complex gain coefficients based on the complex input signal and on feedback samples of the power amplifier output.

30. The system of claim 29, further comprising:
a predistorted drive calculator, executable by the signal processor, for producing a complex predistorted drive signal based on the complex input signal and the complex lookup table coefficients.

31. The system of claim 30, further comprising:
an error-vector calculator, executable by the signal processor, for producing a plurality of complex error components based on the complex input signal and the predistorted drive signal.

32. A method of generating a predistorted drive signal for driving an amplifier, comprising:
receiving a complex input signal;
performing a digital-to-analog conversion on the complex input signal;
filtering the converted complex input signal to generate a filtered reference input signal;
generating an error-vector signal based on the complex input signal;
filtering the error-vector signal;
combining the filtered error-vector signal and the filtered reference input signal to generate the predistorted drive signal; and
wherein the step of generating includes:
multiplying the complex input signal by a plurality of complex gain coefficients, each of the complex gain coefficients being selected by an index determined by the magnitude of the complex input signal.

33. The method of claim 32, wherein the step of filtering the converted complex input signal includes:
selectively filtering the converted complex input signal using a narrow band filter during normal operation and a wide band filter during training operation.

34. The method of claim 32, further comprising:
decoupling the filtered error-vector signal relative to the filtered reference input signal.

* * * * *